(12) United States Patent
Zach et al.

(10) Patent No.: US 11,829,077 B2
(45) Date of Patent: Nov. 28, 2023

(54) SYSTEM AND METHOD FOR DETERMINING POST BONDING OVERLAY

(71) Applicant: KLA Corporation, Milpitas, CA (US)

(72) Inventors: Franz Zach, Los Gatos, CA (US); Mark D. Smith, Austin, TX (US); Xiaomeng Shen, Milpitas, CA (US); Jason Saito, Milpitas, CA (US); David Owen, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 247 days.

(21) Appl. No.: 17/161,369

(22) Filed: Jan. 28, 2021

(65) Prior Publication Data

US 2022/0187718 A1 Jun. 16, 2022

Related U.S. Application Data

(60) Provisional application No. 63/124,629, filed on Dec. 11, 2020.

(51) Int. Cl.
  *G03F 7/20* (2006.01)
  *G01N 21/95* (2006.01)
  (Continued)

(52) U.S. Cl.
  CPC ..... *G03F 7/70633* (2013.01); *G01B 9/02021* (2013.01); *G01B 11/16* (2013.01);
  (Continued)

(58) Field of Classification Search
  CPC . G03F 7/70633; G03F 7/70783; H01L 22/12; H01L 21/67288; H01L 22/20;
  (Continued)

(56) References Cited

U.S. PATENT DOCUMENTS

| 5,202,748 A | 4/1993 | MacDonald et al. |
|---|---|---|
| 6,064,486 A | 5/2000 | Chen et al. |

(Continued)

FOREIGN PATENT DOCUMENTS

| CA | 2334388 A1 | 10/2000 |
|---|---|---|
| CN | 100552908 C | 10/2009 |

(Continued)

OTHER PUBLICATIONS

Aitken et al., (2006). Discussion of tooling solutions for the direct bonding of silicon wafers. Microsystem Technologies. 12. 413-417. 10.1007/s00542-005-0028-4.

(Continued)

*Primary Examiner* — Gordon J Stock, Jr.
(74) *Attorney, Agent, or Firm* — Suiter Swantz pc llo

(57) ABSTRACT

A wafer shape metrology system includes a wafer shape metrology sub-system configured to perform one or more stress-free shape measurements on a first wafer, a second wafer, and a post-bonding pair of the first and second wafers. The wafer shape metrology system includes a controller communicatively coupled to the wafer shape metrology sub-system. The controller is configured to receive stress-free shape measurements from the wafer shape sub-system; predict overlay between one or more features on the first wafer and the second wafer based on the stress-free shape measurements of the first wafer, the second wafer, and the post-bonding pair of the first wafer and the second wafer; and provide a feedback adjustment to one or more process tools based on the predicted overlay. Additionally, feedforward and feedback adjustments may be provided to one or more process tools.

19 Claims, 5 Drawing Sheets

(51) Int. Cl.
- *G01B 9/02017* (2022.01)
- *H01L 21/66* (2006.01)
- *H01L 21/67* (2006.01)
- *G01B 11/16* (2006.01)
- *G01B 11/24* (2006.01)
- *G03F 7/00* (2006.01)

(52) U.S. Cl.
CPC ............ *G01B 11/161* (2013.01); *G01B 11/24* (2013.01); *G01B 11/2441* (2013.01); *G01N 21/9501* (2013.01); *H01L 21/67288* (2013.01); *H01L 22/12* (2013.01); *H01L 22/20* (2013.01)

(58) Field of Classification Search
CPC ............ G01B 9/02021; G01B 11/0625; G01B 11/0641; G01B 11/16; G01B 11/161; G01B 11/24; G01B 11/2441; G01B 11/255; G01B 11/272; G01B 11/306; G01N 21/9501; G01N 21/95607
See application file for complete search history.

(56) References Cited

U.S. PATENT DOCUMENTS

| | | | |
|---|---|---|---|
| 6,238,939 B1 | 5/2001 | Wachs et al. | |
| 6,335,791 B1 | 1/2002 | Miyatake | |
| 6,600,565 B1 | 7/2003 | Suresh et al. | |
| 6,762,846 B1 | 7/2004 | Poris | |
| 6,847,458 B2 | 1/2005 | Freischlad et al. | |
| 7,079,257 B1 | 7/2006 | Kirkpatrick et al. | |
| 7,433,051 B2 | 10/2008 | Owen | |
| 7,570,796 B2 | 8/2009 | Zafar et al. | |
| 7,676,077 B2 | 3/2010 | Kulkarni et al. | |
| 8,163,570 B2 | 4/2012 | Castex et al. | |
| 8,394,719 B2* | 3/2013 | Tsen | H01L 22/20 438/692 |
| 8,475,612 B2 | 7/2013 | Gaudin | |
| 8,575,002 B2* | 11/2013 | Broekaart | H01L 25/50 438/455 |
| 8,640,548 B2 | 2/2014 | Wimplinger | |
| 8,892,237 B2* | 11/2014 | Vaid | H01L 22/20 700/121 |
| 8,900,885 B1 | 12/2014 | Hubbard et al. | |
| 8,949,057 B1 | 2/2015 | Seong et al. | |
| 9,087,176 B1* | 7/2015 | Chang | G03F 1/36 |
| 9,116,442 B2 | 8/2015 | Adel et al. | |
| 9,121,684 B2 | 9/2015 | Tang et al. | |
| 9,312,161 B2 | 4/2016 | Wimplinger et al. | |
| 9,354,526 B2* | 5/2016 | Vukkadala | G01B 11/2441 |
| 9,852,972 B2 | 12/2017 | Seddon et al. | |
| 9,915,625 B2 | 3/2018 | Gao et al. | |
| 10,234,772 B2* | 3/2019 | Bangar | G03F 7/70633 |
| 10,267,746 B2 | 4/2019 | Duffy et al. | |
| 10,325,798 B2 | 6/2019 | Wimplinger et al. | |
| 10,401,279 B2* | 9/2019 | Vukkadala | G01L 5/0047 |
| 10,788,759 B2 | 9/2020 | Tsai et al. | |
| 2002/0071112 A1 | 6/2002 | Smith et al. | |
| 2002/0105649 A1 | 8/2002 | Smith et al. | |
| 2004/0023466 A1 | 2/2004 | Yamauchi | |
| 2004/0075825 A1 | 4/2004 | Suresh et al. | |
| 2005/0066739 A1 | 3/2005 | Gotkis et al. | |
| 2005/0087578 A1 | 4/2005 | Jackson | |
| 2005/0147902 A1 | 7/2005 | Schaar et al. | |
| 2005/0254030 A1 | 11/2005 | Tolsma et al. | |
| 2005/0271955 A1 | 12/2005 | Cherala et al. | |
| 2006/0141743 A1 | 6/2006 | Best et al. | |
| 2006/0170934 A1 | 8/2006 | Picciotto et al. | |
| 2006/0216025 A1 | 9/2006 | Kihara et al. | |
| 2007/0037318 A1 | 2/2007 | Kim | |
| 2007/0064243 A1 | 3/2007 | Yunus et al. | |
| 2007/0212856 A1 | 9/2007 | Owen | |
| 2007/0242271 A1 | 10/2007 | Moon | |
| 2008/0030701 A1 | 2/2008 | Lof | |
| 2008/0057418 A1 | 3/2008 | Seltmann et al. | |
| 2008/0106714 A1 | 5/2008 | Okita | |
| 2008/0182344 A1 | 7/2008 | Mueller et al. | |
| 2008/0188036 A1 | 8/2008 | Tulipe et al. | |
| 2008/0199978 A1 | 8/2008 | Fu et al. | |
| 2008/0316442 A1 | 12/2008 | Adel et al. | |
| 2010/0102470 A1 | 4/2010 | Mokaberi | |
| 2011/0172982 A1* | 7/2011 | Veeraraghavan | G01B 11/24 703/13 |
| 2011/0210104 A1 | 9/2011 | Wahlsten et al. | |
| 2011/0265578 A1 | 11/2011 | Johnson et al. | |
| 2013/0054154 A1* | 2/2013 | Broekaart | G01B 21/32 702/35 |
| 2014/0057450 A1 | 2/2014 | Bourbina et al. | |
| 2014/0102221 A1 | 4/2014 | Rebhan et al. | |
| 2014/0209230 A1 | 7/2014 | Wagenleitner | |
| 2015/0044786 A1 | 2/2015 | Huang et al. | |
| 2015/0120216 A1 | 4/2015 | Vukkadala et al. | |
| 2015/0279709 A1 | 10/2015 | La Tulipe et al. | |
| 2016/0005662 A1 | 1/2016 | Yieh et al. | |
| 2017/0243853 A1 | 8/2017 | Huang et al. | |
| 2018/0165404 A1 | 6/2018 | Eyring et al. | |
| 2018/0342410 A1 | 11/2018 | Hooge et al. | |
| 2019/0148184 A1* | 5/2019 | Sugaya | H01L 21/681 438/455 |
| 2019/0206711 A1 | 7/2019 | Wimplinger et al. | |
| 2019/0287854 A1 | 9/2019 | Miller et al. | |
| 2019/0353582 A1* | 11/2019 | Vukkadala | G01L 1/00 |
| 2020/0018709 A1* | 1/2020 | Hosler | H01L 21/67259 |
| 2020/0091015 A1 | 3/2020 | Sugaya et al. | |
| 2020/0328060 A1 | 10/2020 | Iizuka | |
| 2021/0296147 A1* | 9/2021 | Mizuta | H01L 21/67288 |
| 2022/0187718 A1 | 6/2022 | Zach et al. | |
| 2022/0230099 A1 | 7/2022 | Pandith et al. | |
| 2022/0344282 A1* | 10/2022 | Subrahmanyan | G03F 7/7065 |
| 2023/0030116 A1 | 2/2023 | Zach et al. | |
| 2023/0032406 A1 | 2/2023 | Zach et al. | |
| 2023/0035201 A1 | 2/2023 | Zach et al. | |

FOREIGN PATENT DOCUMENTS

| | | |
|---|---|---|
| CN | 100562784 C | 11/2009 |
| CN | 101727011 A | 6/2010 |
| CN | 102656678 B | 4/2015 |
| CN | 104977816 A | 10/2015 |
| CN | 103283000 B | 10/2016 |
| CN | 106547171 A | 3/2017 |
| CN | 104658950 B | 1/2018 |
| CN | 109451761 A | 3/2019 |
| CN | 106887399 B | 2/2020 |
| CN | 109891563 B | 2/2021 |
| EP | 1829130 A1 | 9/2007 |
| EP | 2299472 A1 | 3/2011 |
| EP | 2463892 A1 | 6/2012 |
| EP | 2463892 B1 | 4/2013 |
| EP | 2656378 B1 | 3/2015 |
| EP | 2863421 A1 | 4/2015 |
| EP | 1829130 B1 | 7/2016 |
| EP | 2854157 B1 | 1/2019 |
| EP | 3460833 A1 | 3/2019 |
| GB | 2462734 B | 5/2010 |
| JP | H11135413 A | 5/1999 |
| JP | H11176749 A | 7/1999 |
| JP | 2001068429 A | 3/2001 |
| JP | 2001077012 A | 3/2001 |
| JP | 2002118052 A | 4/2002 |
| JP | 2002229044 | 9/2005 |
| JP | 2005233928 A | 9/2005 |
| JP | 2005251972 A | 9/2005 |
| JP | 2006186377 A | 7/2006 |
| JP | 2007158200 A | 6/2007 |
| JP | 2007173526 A | 7/2007 |
| JP | 2009113312 A | 5/2009 |
| JP | 2009529785 A | 8/2009 |
| JP | 2009239095 A | 10/2009 |
| JP | 2009294001 B | 12/2009 |
| JP | 2010529659 A | 8/2010 |
| JP | 2010272707 A | 12/2010 |
| JP | 5611371 B2 | 10/2014 |
| JP | 6279324 B2 | 2/2018 |

(56) References Cited

FOREIGN PATENT DOCUMENTS

| | | |
|---|---|---|
| JP | 2022098312 A | 7/2022 |
| KR | 20040014686 A | 2/2004 |
| KR | 20040046696 A | 6/2004 |
| KR | 100914446 B1 | 8/2009 |
| KR | 20090099871 A | 9/2009 |
| KR | 101313909 B1 | 10/2013 |
| KR | 101801409 B1 | 12/2017 |
| KR | 101849443 B1 | 4/2018 |
| KR | 101866622 B1 | 6/2018 |
| KR | 101866719 B1 | 6/2018 |
| KR | 20180065033 A | 6/2018 |
| SG | 181435 A1 | 7/2012 |
| SG | 187694 A1 | 3/2013 |
| TW | I447842 B | 8/2014 |
| TW | I563548 B | 12/2016 |
| TW | I563549 B | 12/2016 |
| TW | I618130 B | 3/2018 |
| TW | I680506 B | 12/2019 |
| WO | 2005067046 A1 | 7/2005 |
| WO | 2009113312 A1 | 9/2009 |
| WO | 2012079786 A1 | 6/2012 |
| WO | 2012083978 A1 | 6/2012 |
| WO | 2012126752 A1 | 9/2012 |
| WO | 2012135513 A1 | 10/2012 |
| WO | 2013158039 A3 | 6/2016 |
| WO | 2019146427 A1 | 8/2019 |
| WO | 2020226152 A1 | 11/2020 |
| WO | 2021106527 A1 | 6/2021 |

OTHER PUBLICATIONS

Aitken et al., "Glass-Glass Wafer Bonding for Microfluidic Devices." Proceedings of the 2008 Second International Conference on Integration and Commercialization of Micro and Nanosystems. 2008 Second International Conference on Integration and Commercialization of Micro and Nanosystems. Clear Water Bay, Kowloon, Hong Kong. Jun. 3-5, 2008. pp. 529-533. ASME. https://doi.org/10.1115/MicroNano2008-70293.

Asundi et al., "Rapid Defect Detections of Bonded Wafer Using Near Infrared Polariscope", Nanyang Technological University Singapore2011, Retrieved From https://hdl.handle.net/1035680598.

Burns J. et al. (2008) An SOI-Based 3D Circuit Integration Technology. In: Tan C., Gutmann R., Reif L. (eds) Wafer Level 3-D ICs Process Technology. Integrated Circuits and Systems. Springer, Boston, MA. https://doi.org/10.1007/978-0-387-76534-1_8.

Burns, J.A., et al., "A wafer-scale 3-D circuit integration technology," in IEEE Transactions on Electron Devices, vol. 53, No. 10, pp. 2507-2516, Oct. 2006, doi: 10.1109/TED.2006.882043.

Byelyayev, Anton, "Stress diagnostics and crack detection in full-size silicon wafers using resonance ultrasonic vibrations" (2005). Graduate Theses and Dissertations.http://scholarcommons.usf.edu/etd/2969.

Chen, Kuan-Neng (2005). Copper Wafer Bonding in Three-Dimensional Integration [Unpublished Doctoral thesis] Massachusetts Institute of Technology.

Choi et al., (2005). Distortion and overlay performance of UV step and repeat imprint lithography. Microelectronic Engineering. 78-79. 633-640. 10.1016/j.mee.2004.12.097.

De Wolf, "Raman Spectroscopy: About Chips and Stress", Ramanspectoscopy, IMEC, Kapeldreef 75, B-3001 Leuven, Belgium 2003.

Di Cioccio, L. et al., "Direct bonding for wafer level 3D integration," 2010 IEEE International Conference on Integrated Circuit Design and Technology, 2010, pp. 110-113, doi: 10.1109/ICICDT.2010.5510276.

Garnier, A. et al., "Results on aligned SiO2/SiO2 direct wafer-to-wafer low temperature bonding for 3D integration," 2009 IEEE International SOI Conference, 2009, pp. 1-2, doi: 10.1109/SOI.2009.5318753.

Gegenwarth et al., "Effect Of Plastic Deformation of Silicon Wafers on Overlay", Proc. SPIE 0100, Developments in Semiconductor Microlithography II, (Aug. 8, 1977); https://doi.org/10.1117/12.955355.

Hanna et al., (1999). Numerical and experimental study of the evolution of stresses in flip chip assemblies during assembly and thermal cycling. 1001-1009. 10.1109/ECTC.1999.776308.

Horn et al., (2008). Detection and Quantification of Surface Nanotopography-Induced Residual Stress Fields in Wafer-Bonded Silicon. Journal of The Electrochemical Society. 155. H36-H42. 10.1149/1.2799880.

Lim, et al., "Warpage Modeling and Characterization to Simulate the Fabrication Process of Wafer-Level Adhesive Bonding," 2007 32nd IEEE/CPMT International Electronic Manufacturing Technology Symposium, 2007, pp. 298-302, doi: 10.1109/IEMT.2007.4417081.

Liu et al., Application of IVS Overlay Measurement to Wager Deformation Characterization Study (2004).

Meinhold et al., "Sensitive strain measurements of bonded SOI films using Moire/spl acute/," in IEEE Transactions on Semiconductor Manufacturing, vol. 17, No. 1, pp. 35-41, Feb. 2004, doi: 10.1109/TSM.2003.823259.

Nagarajan, R. (2009). Commercialization of low temperature copper thermocompression bonding for 3D integrated circuits. [unpublished Masters thesis] Massachusetts Institute of Technology.

Nagaswami et al., Overlay error components in double-patterning lithography, retrieved from Internet Sep. 2010.

Nagaswami, et al., "Double Patterning Lithography Overlay Components," 6th International Symp. on Immersion Lithography Extensions, Prague, Nov. 2009.

Raghunathan et al., "Correlation of overlay performance and reticle substrate non-flatness effects in EUV lithography", Proc. SPIE 7488, Photomask Technology 2009, 748816 (Sep. 30, 2009); https://doi.org/10.1117/12.834746.

Rudack et al., "IR microscopy as an early electrical yield indicator in bonded wafer pairs used for 3D integration," Proc. SPIE 7638, Metrology, Inspection, and Process Control for Microlithography XXIV, 763815 (Apr. 1, 2010); https://doi.org/10.1117/12.848400.

Search Report and Written Opinion in International Application No. PCT/US2022/036745 dated Nov. 9, 2022, 8 pages.

Search Report and Written Opinion in International Application No. PCT/US2022/037522 dated Nov. 9, 2022. 9 pages.

Search Report and Written Opinion in International Application No. PCT/US2022/038412 dated Nov. 16, 2022, 8 pages.

Shetty, et al., "Impact of laser spike annealing dwell time on wafer stress and photolithography overlay errors," 2009 International Workshop on Junction Technology, 2009, pp. 119-122, doi: 10.1109/IWJT.2009.5166234.

Steen et al., (2007). Overlay as the key to drive wafer scale 3D integration. Microelectronic Engineering. 84. 1412-1415. 10.1016/j.mee.2007.01.231.

Tanaka, Tetsu et al., "3D LSI technology and reliability issues", Digest of Technical Papers—Symposium on VLSI Technology (2011).

Tupek, Michael et al., "Submicron aligned wafer bonding via capillary forces." Journal of Vacuum Science & Technology B 25 (2007): 1976-1981.

Turner et al., "Predicting distortions and overlay errors due to wafer deformation during chucking on lithography scanners," J. Micro/Nanolith. MEMS MOEMS 8(4) 043015 (Oct. 1, 2009) https://doi.org/10.1117/1.3247857.

Turner, K. T.et al., "Modeling of direct wafer bonding: Effect of wafer bow and etch patterns", Journal of Applied Physics, vol. 92, No. 12, pp. 7658-7666, 2002. doi:10.1063/1.1521792.

Y Gogotsi et al., "Raman Microspectroscopy Study of Processing-Induced Phase Transformations and Residual Stress in Silicon", Semiconductor Science and Technology, vol. 14, No. 10, Department of Mechanical Engineering, University of Illinois at Chicago, Chicago, IL, Mar. 4, 1999.

Turner, Kevin T., "Wafer-Bonding: Mechanics-Based Models and Experiments", Massachusetts Institute of Technology, May 2004, Thesis, 186 pages.

U.S. Appl. No. 17/589,516, filed Jan. 31, 2022, Franz Zach.

(56) References Cited

OTHER PUBLICATIONS

U.S. Appl. No. 17/589,630, filed Jan. 31, 2022, Franz Zach.
U.S. Appl. No. 17/589,706, filed Jan. 31, 2022, Franz Zach.
Aitken, et al. "Discussion of tooling solutions for the direct bonding of silicon wafers." Microsystem Technologies 12(2006): 413-417.
Burns et al., "A wafer-scale 3-D circuit integration technology," in IEEE Transactions on Electron Devices, vol. 53, No. 10, pp. 2507-2516, Oct. 2006, doi: 10.1109/TED.2006.882043.
Burns, et al. "An SOI-based three-dimensional integrated circuit technology." 2000 IEEE International SOI Conference. Proceedings (Cat. No. 00CH37125) (2000): 20-21.
Chan, et al. "An approach for alignment, mounting, and integration of IXO mirror segments." Optical Engineering + Applications (2009).
Chen, Kuan-Neng (2005). Copper Wafer Bonding in Three-Dimensional Integration [Published Doctoral thesis] Massachusetts Institute of Technology.
Choi, et al., Distortion and overlay performance of UV step and repeat imprint lithography, Microelectronic Engineering, vols. 78-79, 2005, pp. 633-640, ISSN 0167-9317, https://doi.org/10.1016/j.mee.2004.12.097.
Cotte, et al., "Film stress changes during anodic bonding of NGL masks," Proc. SPIE 3997, Emerging Lithographic Technologies IV, (Jul. 21, 2000); https://doi.org/10.1117/12.390089.
Di Cioccio, et al., "Direct bonding for wafer level 3D integration," 2010 IEEE International Conference on Integrated Circuit Design and Technology, 2010, pp. 110-113, doi: 10.1109/ICICDT.2010.5510276.
Feng, et al., (Jan. 14, 2007). "On the Stoney Formula for a Thin Film/Substrate System With Nonuniform Substrate Thickness." ASME. J. Appl. Mech. Nov. 2007; 74(6): 1276-1281. https://doi.org/10.1115/1.2745392.
Garnier, et al., "Results on aligned SiO2/SiO2 direct wafer-to-wafer low temperature bonding for 3D integration," 2009 IEEE International SOI Conference, 2009, pp. 1-2, doi: 10.1109/SOI.2009.5318753.
Goyal, et al., "Solder bonding for microelectromechanical systems (MEMS) applications," Proc. SPIE 4980, Reliability, Testing, and Characterization of MEMS/MOEMS II, (Jan. 16, 2003); https://doi.org/10.1117/12.478202.
Hanna, et al., "Numerical and experimental study of the evolution of stresses in flip chip assemblies during assembly and thermal cycling," 1999 Proceedings. 49th Electronic Components and Technology Conference (Cat. No. 99CH36299), 1999, pp. 1001-1009, doi: 10.1109/ECTC.1999.776308.
Huston, et al., (2004). Active membrane masks for improved overlay performance in proximity lithography. Proc SPIE. 5388. 11-19. 10.1117/12.546598.
Liu, et al., "Application of IVS Overiay Measurement to Wafer Deformation Characterization Study." (2004).
Meinhold, et al., (2004). Sensitive Strain Measurements of Bonded SOI Films Using Moiré. Semiconductor Manufacturing, IEEE Transactions on. 17. 35-41. 10.1109/TSM.2003.823259.
Nagarajan, R. (2008). Commercialization of low temperature copper thermocompression bonding for 3D integrated circuits. [Published Masters thesis] Massachusetts Institute of Technology.
Nagaswami, et al., "DPL Overlay Components," 6th International Symp. on Immersion Lithography Extensions, Prague, Nov. 2009.
Nagaswami, et al., (2010). Overlay error components in double-patterning lithography. Solid State Technology. 53. 26-28.
Raghunathan, et al., (2009). Correlation of overlay performance and reticle substrate non-flatness effects in EUV lithography. Proc SPIE. 7488. 10.1117/12.834746.
Rudack, et al., (2010). IR microscopy as an early electrical yield indicator in bonded wafer pairs used for 3D integration. 10.1117/12.848400.
Schaper,et al, "Induced thermal stress fields for three-dimensional distortion control of Si wafer topography", <i>Review of Scientific Instruments</i>, vol. 75, No. 6, pp. 1997-2002, 2004. doi:10.1063/1.1753101.
Steen, et al. "Overlay as the key to drive wafer scale 3D integration." Microelectronic Engineering 84 (2007): 1412-1415.
Tippur, Hareesh V . . . "Simultaneous and real-time measurement of slope and curvature fringes in thin structures using shearing interferometery." Optical Engineering 43 (2004): 3014-3020.
Tupek, et al., "Submicron aligned wafer bonding via capillary forces." Journal of Vacuum Science & Technology B 25 (2007): 1976-1981.
Turner, et al., (2002). Modeling of direct wafer bonding: Effect of wafer bow and etch patterns. Journal of Applied Physics. 92. 7658-7666. 10.1063/1.1521792.
Turner, et al., (2004). Mechanics of wafer bonding: Effect of clamping. Journal of Applied Physics. 95. 10.1063/1.1629776.
Turner, et al., "Mechanics of direct wafer bonding." Proceedings of the Royal Society A: Mathematical, Physical and Engineering Sciences 462 (2005): 171-188.
Turner, Kevin T. et al. "Predicting distortions and overlay errors due to wafer deformation during chucking on lithography scanners." Journal of Micro-nanolithography Mems and Moems 8 (2009): 043015.
International Search Report and Written Opinion in Application No. PCT/US2021/061310 dated Mar. 28, 2022, 8 pages.

\* cited by examiner

SYSTEM AND METHOD FOR DETERMINING POST BONDING OVERLAY

CROSS-REFERENCE TO RELATED APPLICATION

The present application claims the benefit under 35 U.S.C. § 119(e) of U.S. Provisional Application Ser. No. 63/124,629, filed Dec. 11, 2020, which is incorporated herein by reference in the entirety.

TECHNICAL FIELD

The present invention generally relates to the field of metrology, and, more particularly, to a system and method measuring post bonding overlay using a wafer shape metrology tool.

BACKGROUND

The conventional method of measuring post bonding overlay following the bonding of two semiconductor wafers is to place overlay metrology targets (such as box-in-box structures or AIM targets) on either wafer to be bonded. Using infrared light, which penetrates the silicon wafers, an overlay result comparing the position of the targets relative to each other can be made. Traditional overlay measurements such as the ones describe above require the presence of metrology targets on both wafers. This may be disadvantageous for two reasons. First, in some bonding flows, placement of metrology targets on the so-called carrier wafer may require additional processing. Second, the need for targets provides limitations on the density of measurements that can be achieved. Therefore, it would be desirable to provide a system and method that cure the shortfalls of the previous approaches identified above.

SUMMARY

A wafer metrology system is disclosed, in accordance with one or more embodiments of the present disclosure. In one embodiment, the wafer metrology system includes a wafer shape metrology sub-system configured to perform one or more stress-free shape measurements on a first wafer, a second wafer, and a post-bonding pair of the first wafer and the second wafer. In another embodiment, the wafer metrology system includes a controller communicatively coupled to the wafer shape metrology sub-system, the controller including one or more processors configured to execute a set of program instructions stored in a memory. In another embodiment, the set of program instructions are configured to cause the one or more processors to: receive the one or more stress-free shape measurements from the wafer shape sub-system; predict overlay between one or more features on the first wafer and one or more features on the second wafer based on the one or more stress-free shape measurements of the first wafer, the second wafer, and the post-bonding pair of the first wafer and the second wafer; and provide a feedback adjustment to one or more process tools based on the predicted overlay.

A wafer metrology system is disclosed, in accordance with one or more alternative and/or additional embodiments of the present disclosure. In one embodiment, the wafer metrology system includes, a wafer shape metrology sub-system configured to perform one or more stress-free shape measurements on a first wafer and a second wafer. In another embodiment, the wafer shape metrology system includes a controller communicatively coupled to the wafer shape metrology sub-system, the controller including one or more processors configured to execute a set of program instructions stored in a memory. In another embodiment, the set of program instructions are configured to cause the one or more processors to: receive the one or more stress-free shape measurements for the first wafer and the second wafer from the wafer shape sub-system; determine a first shape distortion of the first wafer by comparing the first wafer shape to a first reference structure and determine a second shape distortion by comparing the second wafer shape to a second reference structure; predict overlay between one or more features on the first wafer and one or more features on the second wafer based on the one or more stress-free shape measurements of the first wafer and the second wafer, the first shape distortion, and the second wafer shape distortion; and provide a feed-forward adjustment to one or more process tools based on the predicted overlay.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Figure 1A:
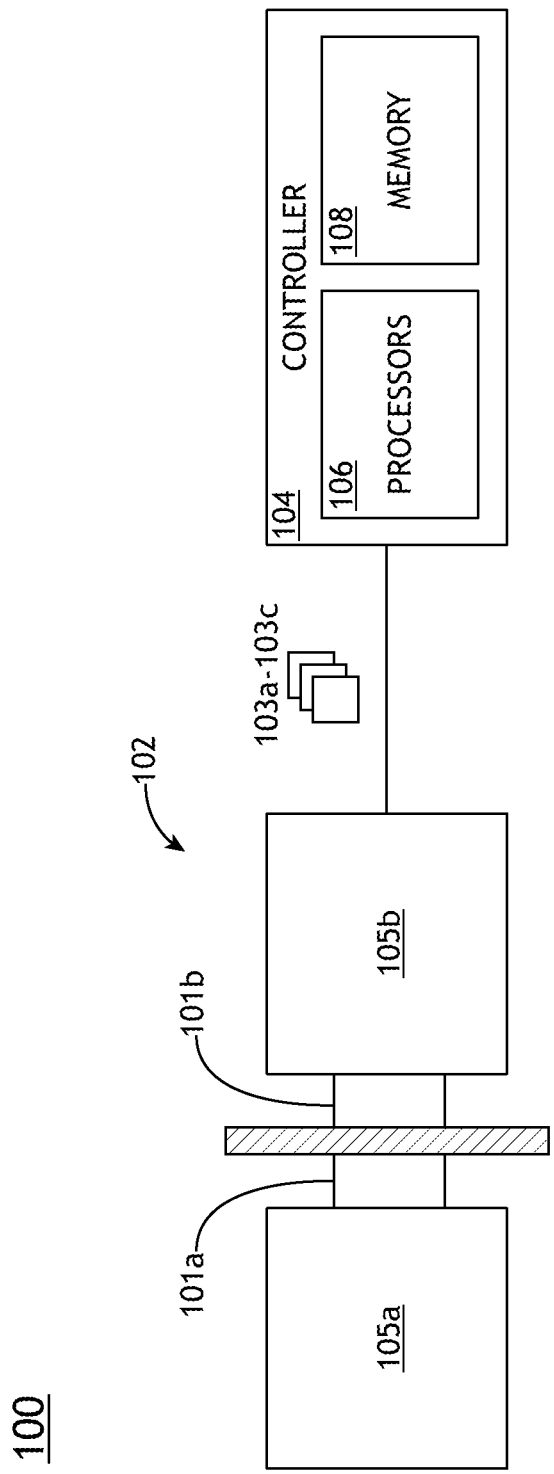
FIG. 1A illustrates a simplified block diagram of a wafer shape metrology system, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Referring generally to FIGS. 1A-3, a system and method for post bonding overlay metrology are illustrated, in accordance with one or more embodiments of the present disclosure.

Embodiments of the present disclosure are directed to the determination of the relative overlay between two bonded wafers caused by shape-based distortions. Embodiments of the present disclosure may utilize shape measurements performed on first and second incoming wafers and the post-bonding wafer pair. Embodiments of the present disclosure may convert the shape data collected from the first wafer and the second wafer (prior to bonding) and the post-bonding pair (after bonding) to predict overlay data and provide feedback control. Additional embodiments of the present disclosure may convert the shape data collected from the first wafer and the second wafer (prior to bonding) and determine shape distortions in the first wafer and the second wafer relative to a reference structure and provide feedforward control. The conversion of shape data to predicted overlay information may be carried out using a machine learning algorithm and/or a mechanical model.

Embodiments of the present disclosure may be implemented to achieve tight overlay requirements on two wafers after a wafer-to-wafer bonding process (e.g., hybrid or fusion bonding). For example, embodiments of the present disclosure may be utilized to minimize/mitigate overlay in the wafer-to-wafer bonding processes involved in the following: fabrication of image sensors (e.g., backlit image sensor technology); 3D NAND technologies where a device wafer and a memory wafer are bonded together; and backside power rail processes in logic device where a device wafer is bonded to a carrier wafer. In all these examples, tight overlay tolerance requirements are present. In image sensor and 3D NAND technologies, the overlay requirements are implemented to ensure a reliable connection between Cu-pads on one wafer to Cu-pads on the other wafer for a direct electrical connection. In the case of backside power rail technologies, it is desirable to achieve a low wafer distortion to ensure that the subsequent lithographic exposure of through silicon vias can achieve the required overlay tolerances given typical correction capabilities of the scanner (e.g., corrections per field (CPE) correction).

The process for determining the post-bonding overlay may include, but is not limited to, the following: i) performing a wafer shape metrology step; ii) performing a feature extraction step where specific parameters of the wafer are extracted from wafer shape data; and iii) converting the extracted parameters to an overlay between features of the first and second wafers via an algorithm (e.g., machine learning algorithm or mechanical model). Based on the results of the overlay prediction a control algorithm (e.g., feedback or feedforward algorithm) may be implemented. In the case of feedback control, the control algorithm may be used to optimize the bonder settings for subsequent wafers. In the case of feedforward control, the shape distortions of the incoming wafers may be used to adjust the bonder settings.

FIG. 1A illustrates a simplified block diagram of a wafer shape metrology system 100 for post-bonding overlay metrology, in accordance with one or more embodiments of the present disclosure.

In embodiments, the system 100 includes a wafer shape metrology sub-system 102. The system 100 may also include a controller 104 communicatively coupled to a detector output of the wafer shape metrology sub-system 102. The controller 104 may include one or more processors 106 and memory 108. The one or more processors 106 of the controller 104 may be configured to execute a set of program instructions stored in memory 108. The set of program instructions may be configured to cause the one or more processors 106 to carry out various steps and processes of the present disclosure.

The wafer shape metrology sub-system 102 may include any wafer geometry tool or system known in the art capable of acquiring one or more shape parameters from one or more wafers. In embodiments, the wafer shape metrology sub-system 102 includes an interferometer sub-system configured to perform one or more metrology and/or characterization processes on one or more wafers. For example, the wafer shape metrology sub-system 102 may include a dual interferometer system (e.g., dual Fizeau interferometer) configured to perform measurements on opposite sides of a wafer. For instance, wafer shape metrology sub-system 102 may include a first interferometer sub-system 105a configured to generate a first illumination beam 101a in order to perform one or more measurements on a first surface of the wafer, and a second interferometer sub-system 105b configured to generate a second illumination beam 101b in order to perform one or more measurements on a second surface of the wafer opposite the first surface. The wafer metrology sub-system 102 may include a Patterned Wafer Geometry (PWG) tool such as the PWG tool produced by KLA INC. The use of interferometry for wafer characterization is generally described in U.S. Pat. No. 6,847,458, filed on Mar. 20, 2003; U.S. Pat. No. 8,949,057, filed on Oct. 27, 2011; and U.S. Pat. No. 9,121,684, filed on Jan. 15, 2013, which are incorporated herein by reference in their entirety.

It is noted that dual-sided interferometry, such as a PWG tool, may be of particular usefulness for implementation in the context of the processes of the present disclosure. For example, thickness change information can be an input into the machine learning algorithm and/or the mechanical model of the present disclosure. Additionally, dual-sided measurement provide flexibility in the event one surface has attributes that makes measurement unreliable. In addition, dual-sided measurements allow for the averaging of shape information from two measurements, improving reliability.

It is noted herein that the scope of the present disclosure is not limited to a dual interferometer system of a PWG implementation and may be extended to encompass any wafer metrology system or tool known in the art including, but not limited to, single-sided interferometer systems.

In embodiments, the wafer shape metrology sub-system 102 is configured to perform wafer shape measurements on wafers while in a stress-free or near stress-free state. For the purposes of the present disclosure, the term "stress free" should be interpreted to mean a configuration with little force applied to the wafer from external sources. The term "stress free" may alternatively be interpreted as "free standing." With external stresses removed, remnant deviations from a flat wafer shape are typically induced through stressed layers present on the frontside of the wafer or due to stresses imposed by the bonding process. It is noted that these stresses caused by layers present on the wafers are interpreted as internal stresses. In this sense, 'shape' of a wafer is a combination of 'natural shape' (i.e., bare wafer shape) and the shape caused by internal stresses on either surface of the wafer such as thin-films.

Figure 1B:
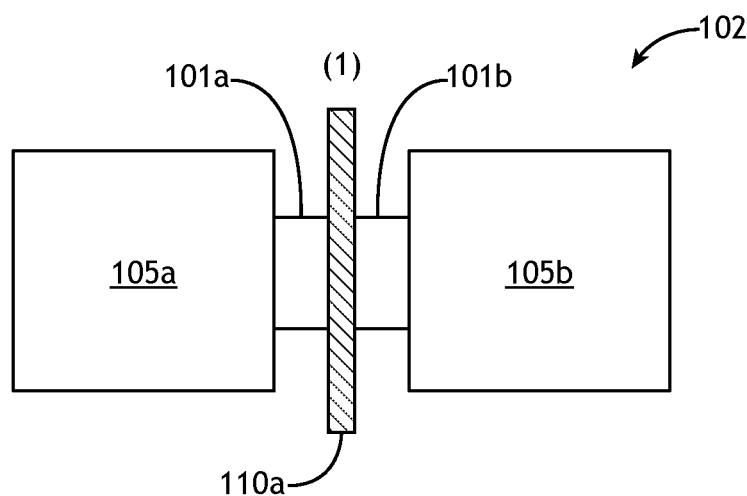
FIG. 1B illustrates a conceptual view of the wafer shape metrology system performing wafer shape measurements on a first wafer, a second wafer, and a post-bonded pair of wafers, in accordance with one or more embodiments of the present disclosure.
Figure 1B:
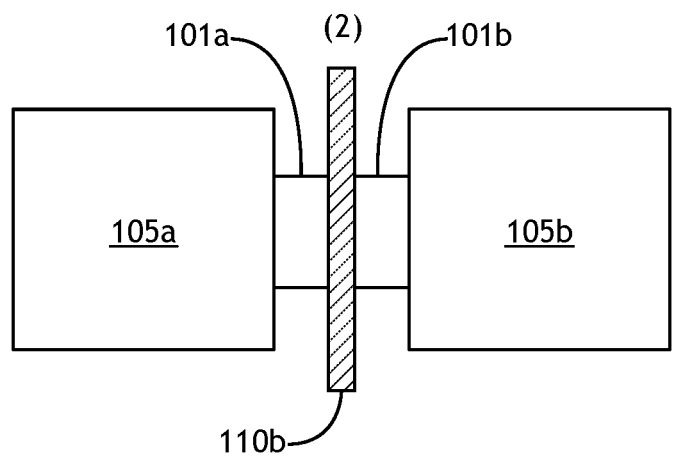
Figure 1B:
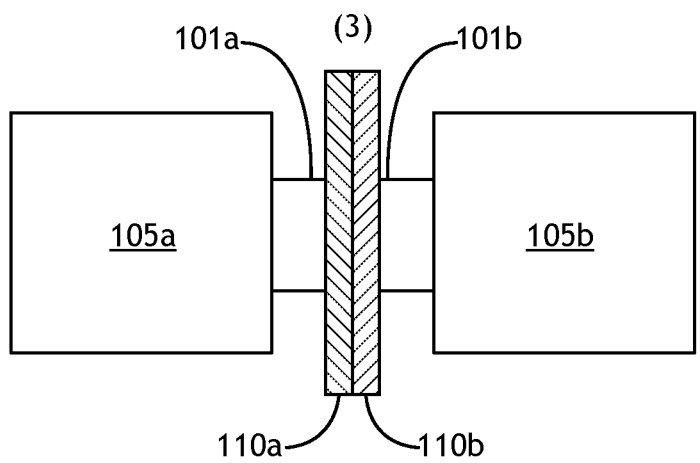

In embodiments, as shown in FIG. 1B, the wafer metrology sub-system 102 may perform (1) shape measurements on a first wafer; (2) shape measurements on a second wafer; and (3) shape measurements on the post-bonding pair of wafers. It is noted that measurements on the pre-bonded first and second wafers may be used to predict shape of the post-bonded pair of wafers based on mismatch of the shapes of the first and second wafers and the effect of the bonder and bonding process on the post-bonded pair.

In embodiments, the wafer metrology sub-system 102 may perform a first shape measurement on a first wafer 110a and then transmit the shape measurement data to the controller 104 via data signal 103a. The wafer metrology sub-system 102 may perform a second shape measurement on a second wafer 110b and then transmit the shape measurement data to the controller 104 via data signal 103b. Then, the first wafer 110a and the second wafer 110b may undergo a bonding process via a bonder (not shown) to form a post-bonding wafer pair 110c. The wafer metrology sub-system 102 may perform a third shape measurement on the post-bonding wafer pair 110c and then transmit the shape measurement data to the controller 104 via data signal 103c.

In embodiments, following the bonding process, the controller 104 converts the measured shape information for the first wafer 110a, the second wafer 110b, and the post-bonding wafer pair 110c to local shape parameters that characterize local shape characteristics. For example, these parameters may include partial first and second derivatives of the shape or predictions of in-plane displacement from shape using different mechanical models. For instance, the local shape parameters may include, but are not limited to, localized shape curvature (LSC) and/or in-plane distortion (IPD). Additional metrics that have historically been used to predict wafer distortions on a scanner may also be utilized. Such metrics include, but are not limited to mechanical models to describe the relationship between wafer shape and overlay based on approaches such as plate theory, finite element method, or proprietary modeling approaches such as the parameters from the Gen3, Gen4, and/or Gen5 models from KLA corporation.

An explanation for capturing the effects of both incoming and post bonding wafers has been described by K. Turner in his 2004 PhD thesis, *Wafer Bonding: Mechanics-based Models and Experiments, Massachusetts Institute of Technology*. In this approximation, the global bow localized from the final bonded wafer bow (and resulting IPD) can be described by the following equation:

$$\kappa_{bond} = \frac{4}{3}\kappa_{final} - \frac{1}{6}(\kappa_{top} + \kappa_{bottom})$$

where wafer bow is related to κ as follows:

$$\text{wafer bow} = \frac{\kappa r^2}{2}$$

where r is the radius of the wafer. The above relationships describe the wafer bow of the wafer during the bonding process and may be used to characterize the bonding distortions of the wafer. Based on observations in predicting wafer distortions caused while chucking a wafer on a scanner, it is expected that the above equation is not strictly correct for localized distortions.

In embodiments, a first algorithm executed by the controller 104 includes a machine learning algorithm. The machine learning algorithm applied by controller 104 may include any machine learning algorithm known in the art including, but not limited to, a deep learning algorithm. For example, the deep learning algorithm may include, but is not limited to, a neural network (e.g., convolutional neural network (CNN), generative adversarial network (GAN), recurrent neural network (RNN), etc.). In this embodiment, the controller 104 generates multiple parameters from the wafer shape for each measurement (first wafer 110a, second wafer 110b, and post-bonding wafer pair 110c). For example, the controller 104 may generate IPD, Gen4, and the like for the first wafer 110a, the second wafer 110b, and the post-bonding wafer pair 110c on a local basis. Then, the controller 104 may use any of these generated parameters as inputs into the machine learning algorithm. For example, in the case of a neural network, the controller 104 may generate IPD, Gen4, and the like for the first wafer 110a, the second wafer 110b, and the post-bonding wafer pair 110c on a local basis and then input these metrics into the neural network.

In embodiments, the controller 104 may train the machine learning algorithm. For example, the controller 104 may receive and then utilize IR overlay data measured in the same location for training purposes. In embodiments, the alignment induced overlay errors due to relative x-y shifts as well as rigid-body rotational errors are removed from the overlay data used for training. In embodiments, once trained, the machine learning algorithm, such as a neural network, may be used to make overlay predictions.

In an alternative and/or additional embodiment, a mechanical model may be used in place of the machine learning algorithm (or in conjunction with the machine learning model). Similar to the procedures used for predicting overlay for warped wafers chucked on a lithography scanner, the set of mechanical equations describing the wafer shape may be approximately solved. In embodiments, the mechanical model may be based on plate theory or beam theory. In embodiments, the mechanical model is based on a numerical solution to the continuum mechanics equations governing linear elastic deformation of solid bodies. For instance, the mechanical model may include, but is not limited to, techniques such as plate theory or the finite element method. Consistent with the equation shown above, the intermediate shape of the wafer during bonding provides a key adjustment.

Figure 1C:
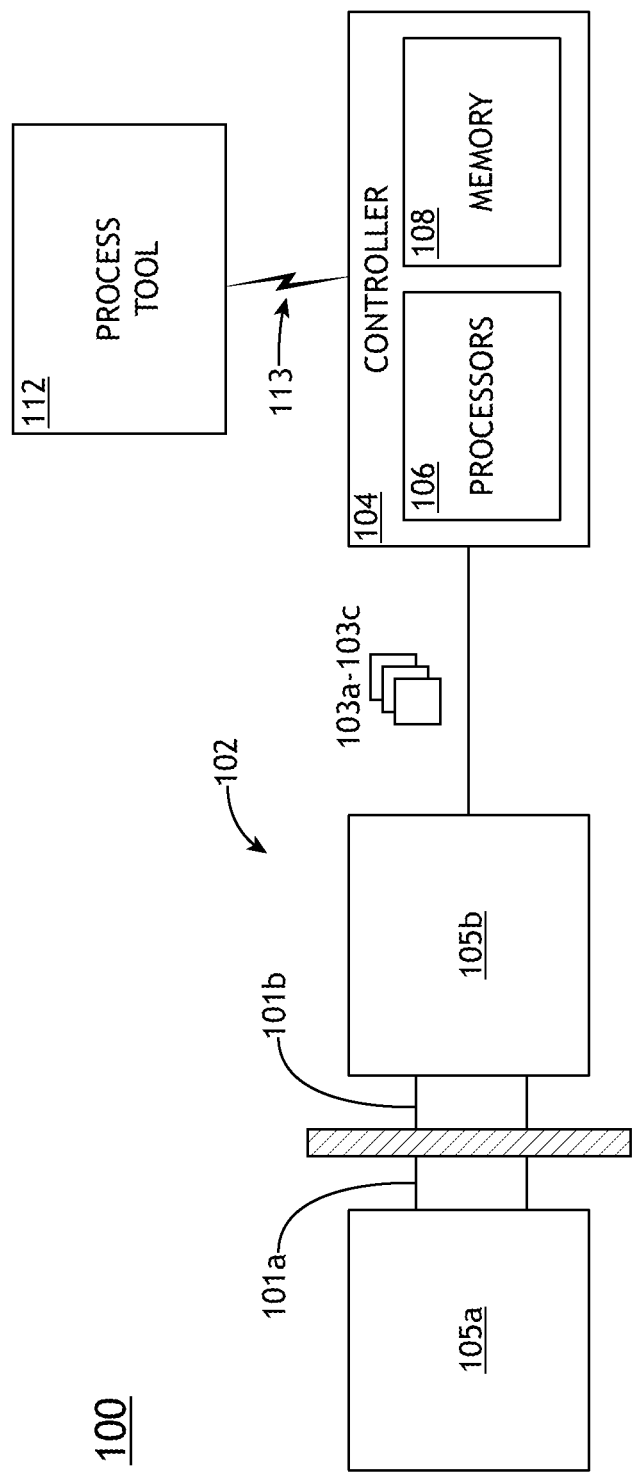
FIG. 1C illustrates a simplified block diagram of the wafer shape metrology system depicting feedback and/or feedforward control of process tool, in accordance with one or more embodiments of the present disclosure.

In embodiments, as shown in FIG. 1C, the controller 104 may provide one or more control signals 113 to one or more process tools 112. For example, the controller 104 may generate one or more feedforward and/or feedback control signals 113 configured to adjust one or more upstream and/or downstream process tools 112. Process tools 112 which may be adjusted may include, but are not limited to, a lithography tool, a deposition tool, a polishing tool, an etching tool, a bonder, and the like. In this regard, the predicted overlay information may be used to minimize (or at least mitigate) the overlay observed on the bonded wafer pair.

In embodiments, the controller 104 may provide feedback control. For example, the predicted post bonding overlay may be used to adjust process controls on the bonder. Examples of such process adjustments include adjustments in the vacuum pressure applied during bonding or adjustments to inhomogeneous temperature distributions. The impact of these changes can be characterized as a control signature. Using standard optimization algorithms and the signatures characterized for the bonder adjustments, a scaled combination of signatures may be used to minimize the resulting overlay.

In additional and/or alternative embodiments, the controller 104 may provide feedforward control. In embodiments, prior to the bonding process, the controller 104 may apply a model to determine a first shape distortion of the first wafer 110a by comparing the first wafer shape to a first reference structure and determine a second shape distortion of the second wafer 110b by comparing the second wafer shape to a second reference structure. The first reference structure and the second reference structure may include, but are not limited to, an ideal flat wafer. In turn, the controller 104 may predict overlay between one or more features on the first wafer 110a and one or more features on the second wafer 110b based on the shape measurements of the first wafer 110a and the second wafer 110b, the first shape distortion, and the second wafer shape distortion. In this regard, the controller 104 may apply the machine learning algorithm and/or the mechanical model as discussed previously herein. Then, the controller 104 may provide a feed-forward adjustment to one or more process tools 112 (e.g., bonder) based on the predicted overlay. For example, for wafers with high initial warp, the varying signatures of the incoming wafer warp impact the outgoing, post bonding distortions. In this case, the post bonding signature can be generated in a modified process. Using prior measurements of the two incoming and one outgoing bonded wafer, the bonding signature may be generated from an initial calibration run. For feedforward control, the incoming signatures are combined to generate a predicted overlay result. This may be optimized in accordance with the procedures described herein to provide the lowest possible post bonding overlay. It is noted herein that pre-bonding shape measurements of wafers 110a, 110b combined with the model for determining distortions can be used to select pairs of wafers for bonding to minimize overlay errors.

The one or more processors 106 of controller 104 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 106 may include any device configured to execute algorithms and/or instructions (e.g., program instructions stored in memory). In one embodiment, the one or more processors 106 may be embodied as a desktop computer, mainframe computer system, workstation, image computer, parallel processor, networked computer, or any other computer system configured to execute a program configured to operate or operate in conjunction with the metrology system 100, as described throughout the present disclosure. Moreover, different sub-systems of the system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 104 may include one or more controllers housed in a common housing or within multiple housings. In this way, any controller or combination of controllers may be separately packaged as a module suitable for integration into metrology system 100. Further, the controller 104 may analyze data received from the wafer metrology sub-system 102 and feed the data to additional components within the metrology system 100 or external to the metrology system 100.

The memory medium 108 may include any storage medium known in the art suitable for storing program instructions executable by the associated one or more processors 106. For example, the memory medium 108 may include a non-transitory memory medium. By way of another example, the memory medium 108 may include, but is not limited to, a read-only memory (ROM), a random-access memory (RAM), a magnetic or optical memory device (e.g., disk), a magnetic tape, a solid-state drive and the like. It is further noted that memory medium 108 may be housed in a common controller housing with the one or more processors 106. In one embodiment, the memory medium 108 may be located remotely with respect to the physical location of the one or more processors 106 and controller 104. For instance, the one or more processors 106 of controller 104 may access a remote memory (e.g., server), accessible through a network (e.g., internet, intranet and the like).

It is noted herein that the one or more components of the disclosed system 100 may be communicatively coupled to the various other components of the system 100 in any manner known in the art. For example, the wafer metrology sub-system 102, controller 104, the process tool 112, and a user interface may be communicatively coupled to each other and other components via a wireline (e.g., copper wire, fiber optic cable, and the like) or wireless connection (e.g., RF coupling, IR coupling, data network communication (e.g., WiFi, WiMax, 3G, 4G, 4G LTE, 5G, Bluetooth, and the like).

Figure 2:
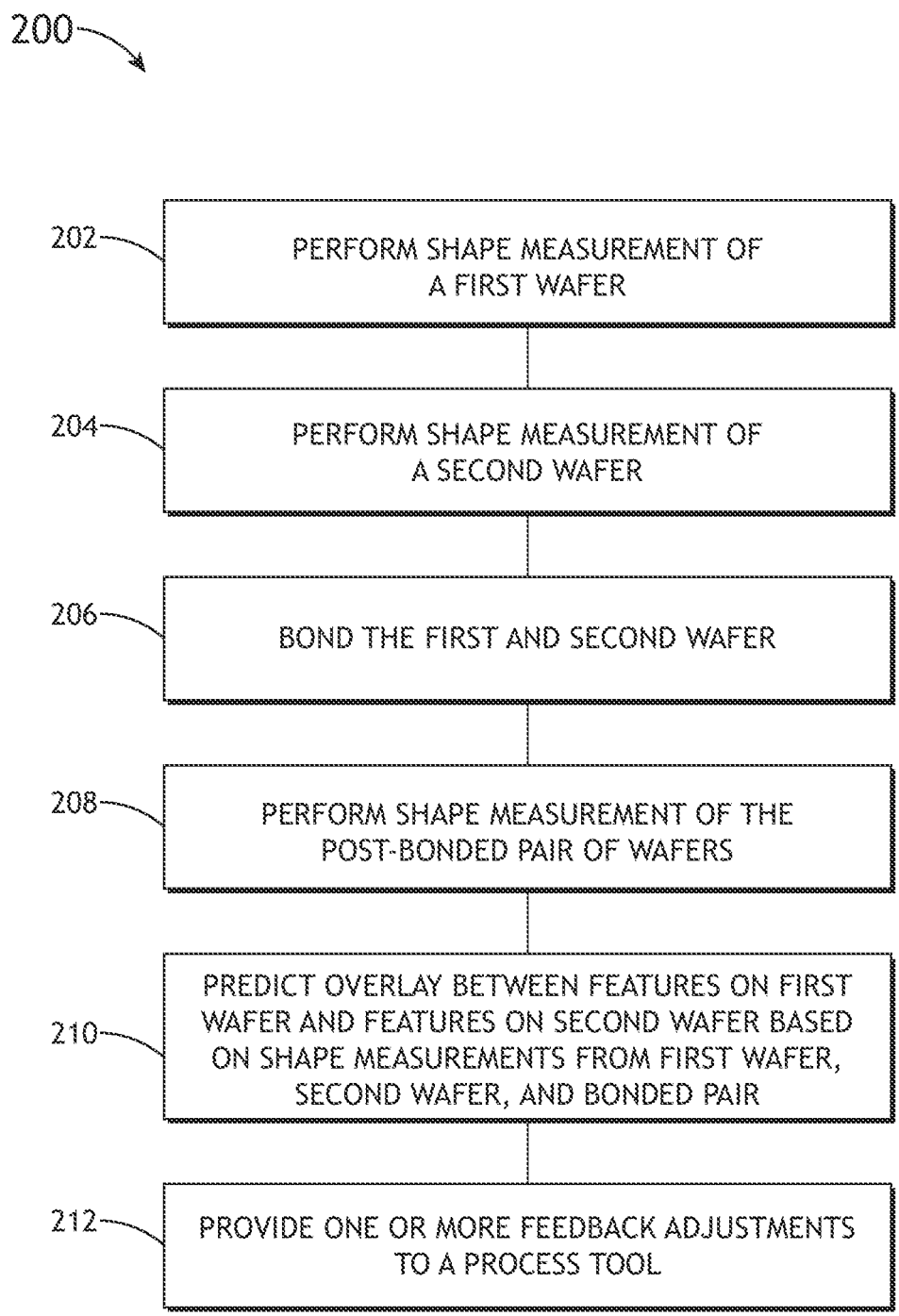
FIG. 2 illustrates a flow diagram depicting a method of determining overlay between wafer features in a post-bonded pair of wafers, in accordance with one or more embodiments of the present disclosure.

FIG. 2 illustrates a method of measuring overlay between features on a post-bonded wafer pair, in accordance with one or more embodiments of the present disclosure. It is noted herein that the steps of method 200 may be implemented all or in part by wafer metrology system 100. It is further recognized, however, that the method 200 is not limited to the wafer metrology system 100 in that additional or alternative system-level embodiments may carry out all or part of the steps of method 200.

In a step 202, a wafer shape measurement is performed on a first wafer. For example, as shown in FIG. 1B, the wafer shape sub-system 102 may perform a wafer shape measurement on a first wafer 110a prior to a wafer bonding process.

In a step 204, a wafer shape measurement is performed on a second wafer. For example, as shown in FIG. 1B, the wafer shape sub-system 102 may perform a wafer shape measurement on a second wafer 110b prior to a wafer bonding process.

In a step 206, the first wafer and the second wafer are bonded to form a bonded pair of wafers. For example, a bonder (not depicted) may bond the first wafer 110a and the second wafer 110b in a wafer-to-wafer bonding process. The bonder may be configured for hybrid wafer bonding or fusion wafer bonding.

In a step 208, a wafer shape measurement is performed on a second wafer post-bonded pair of wafers. For example, as shown in FIG. 1B, the wafer shape sub-system 102 may perform a wafer shape measurement on the post-bonded pair of wafers 110c following the bonding process.

In a step 210, overlay between features on the first wafer and features on the second wafer are predicted based on the shape measurements from the first wafer, the second wafer, and the bonded pair of wafers. In embodiments, the controller 104 may determine or predict overlay between features on the first wafer 110a and features on the second wafer 110b based on the shape measurements from the first wafer 110a, the second wafer 110b, and the bonded pair of wafers 110c. For example, the controller 104 may execute an algorithm that correlates shape information for the first wafer 110a, the second wafer 110b, and the bond pair of wafers 110c to overlay between features on the first wafer 110a and 110b. In a first step, the measured shape information of steps 204, 206, and 208 may be converted by controller 104 to local shape parameters that characterize local shape characteristics. Examples of such parameters are localized shape curvature, IPD, and any other shape metrics used in the art to predict wafer distortions (e.g., distortions on a scanner predicted by mechanical models used to describe the relationship between wafer shape and overlay based on approaches such as plate theory, finite element method, or proprietary modeling approaches such as the parameters from the Gen3, Gen4, and/or Gen5 models from KLA corporation). Then, the acquired parameters are used by the controller 104 to predict overlay. For example, the controller 104 may input the acquired shape parameters into a machine learning algorithm (e.g., neural network), which correlates the acquired shape parameters to overlay between the features of the first wafer 110a and the second wafer 110b in pair of wafers 110c. Appropriate shape parameters for a machine learning algorithm might include local metrics such as curvature or shape slope, or might include global metrics such as fitting the shape of the wafer to a polynomial (e.g., X, Y, $X^2$, XY, $Y^2$, ...) or Zernike polynomials which are naturally defined on a disk. These terms are not limiting, but only given as examples. By way of another example, the controller 104 may input one or more of the acquired shape parameters into a physical/mechanical model to predict overlay between the features of the first wafer 110a and the second wafer 110b in pair of wafers 110c.

In a step 212, one or more feedback adjustments are provided to a process tool. For example, as shown in FIG. 1C, one or more control signals 113 may be transmitted to one or more process tools 112 to adjust one or more states of the one or more process tools 112 to minimize/mitigate overlay between the first wafer 110a and second wafer 110b. For example, the controller 104 may generate one or more feedback control signals configured to adjust one or more upstream process tools. Process tools 112 which may be adjusted may include, but are not limited to, a lithography tool, a deposition tool, a polishing tool, an etching tool, a bonder, and the like. In this regard, the predicted overlay information may be used to minimize (or at least mitigate) the overlay observed on future the bonded wafer pairs.

Figure 3:
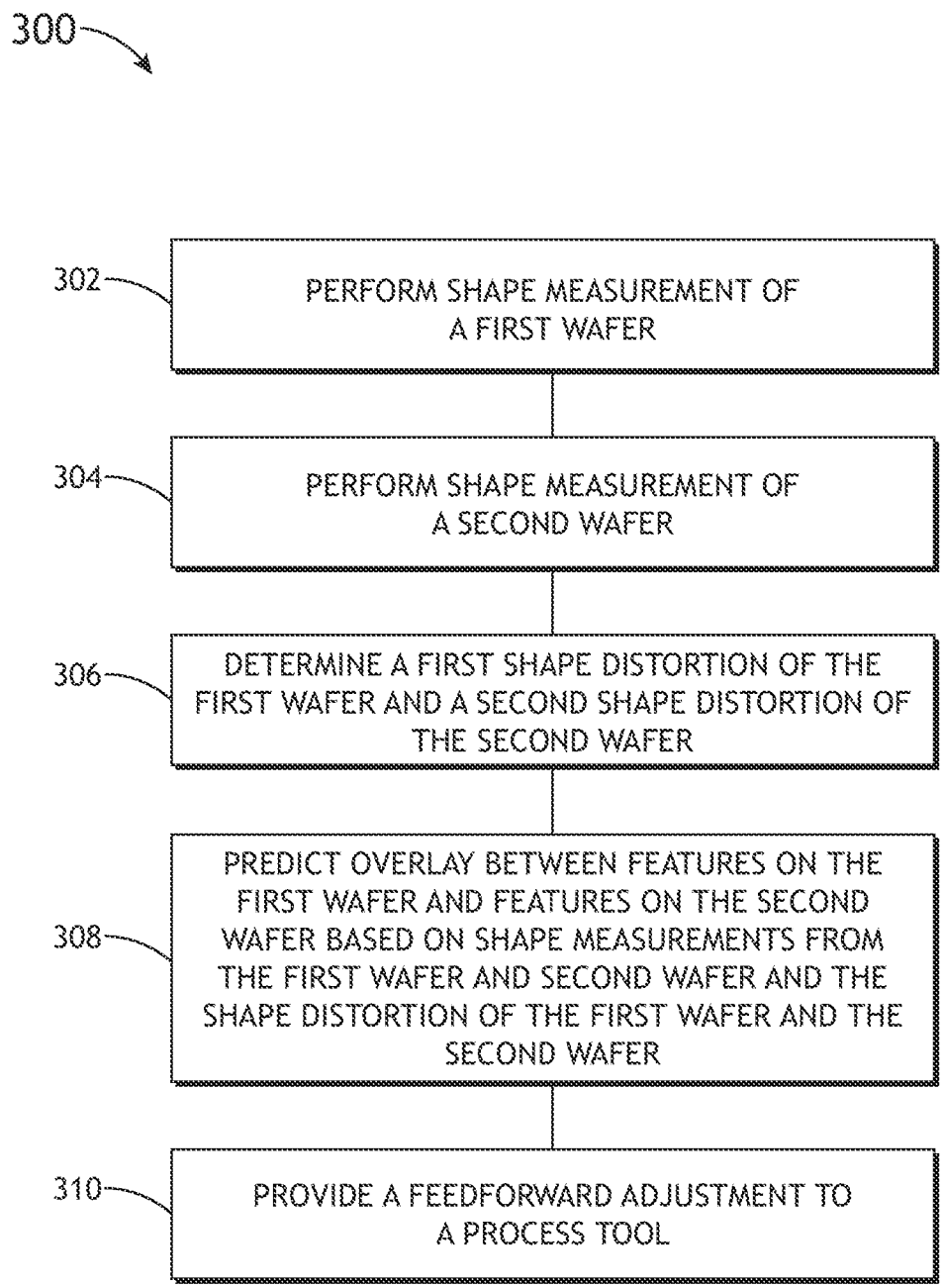
FIG. 3 illustrates a flow diagram depicting a method of predicting overlay caused by bonding two wafers, in accordance with one or more embodiments of the present disclosure.

FIG. 3 illustrates a method of predicting overlay between features on a post-bonded wafer pair, in accordance with one or more embodiments of the present disclosure. It is noted herein that the steps of method 300 may be implemented all or in part by wafer metrology system 100. It is further recognized, however, that the method 300 is not limited to the wafer metrology system 100 in that additional or alternative system-level embodiments may carry out all or part of the steps of method 300. In addition, it is noted that the various steps of method 200 may be interpreted to apply to method 300 unless otherwise noted.

In a step 302, a wafer shape measurement is performed on a first wafer. For example, as shown in FIG. 1B, the wafer shape sub-system 102 may perform a wafer shape measurement on a first wafer 110a prior to a wafer bonding process.

In a step 304, a wafer shape measurement is performed on a second wafer. For example, as shown in FIG. 1B, the wafer shape sub-system 102 may perform a wafer shape measurement on a second wafer 110b prior to a wafer bonding process.

In step 306, a first shape distortion of the first wafer and a second shape distortion of the second wafer is determined. For example, the controller 104 may apply a model (e.g., mechanical model based on plate theory) to compare the shape of the first wafer 110a to a reference structure in order to identify distortions within the first wafer 110a. Similarly, controller 104 may apply the model to compare the shape of the second wafer 110b to a reference structure in order to identify distortions within the second wafer 110b. In embodiments, the reference structure may include an idealized flat wafer. In additional embodiments, the reference structure may include shape information acquired from previously measured wafers.

In step 308, overlay between features on the first wafer and features on the second wafer are predicted based on the shape measurements from the first wafer and the second wafer, and the shape distortions of the first and second wafer. In embodiments, upon receiving the shape information for the first wafer 110a and second wafer 110b from the wafer metrology sub-system 102 and determining shape distortions based on a reference structure, the controller 104 may predict overlay between features on the first wafer 110a and features on the second wafer 110b based on the shape measurements and shape distortions of the first wafer 110a and the second wafer 110b. For example, the controller 104 may execute an algorithm that correlates the shape and shape distortions for the first wafer 110a and the second wafer 110b to overlay between features on the first wafer 110a and 110b. In a first step, the measured shape information of step 204, 206 may be converted by controller 104 to local shape parameters that characterize local shape characteristics. As in method 200, examples of such parameters are localized shape curvature, IPD, and any other shape metrics used in the art to predict wafer distortions (e.g., distortions on a scanner (e.g., Gen3, Gen4, Gen5 parameters)). Then, the acquired parameters and the shape distortion information of step 306 are used by the controller 104 to predict overlay. For example, the controller 104 may input the acquired shape parameters and the shape distortion information into a machine learning algorithm (e.g., neural network), which correlates the acquired shape parameters and shape distortion (prior to bonding) to overlay between the features of the first wafer 110a and the second wafer 110b in the event the wafers 110a, 110b were bonded. As in method 200, appropriate shape parameters for a machine learning algorithm might include local metrics such as curvature or shape slope, or might include global metrics such as fitting the shape of the wafer to a polynomial (e.g., X, Y, $X^2$, XY, $Y^2$, ...) or Zernike polynomials which are naturally defined on a disk. By way of another example, the controller 104 may input one or more of the acquired shape parameters and shape distortions into a physical/mechanical model to predict overlay between the features of the first wafer 110a and the second wafer 110b in a pair of wafers 110c. It is further noted that the machine learning model and the mechanical model may be used in conjunction with each other.

In a step 310, one or more feedforward adjustments are provided to a process tool. For example, as shown in FIG. 1C, one or more feedforward control signals 113 may be transmitted to one or more process tools 112 to adjust one or more states of the one or more process tools 112 to minimize/mitigate overlay between the first wafer 110a and second wafer 110b. For example, the controller 104 may generate one or more feed-forward control signals configured to adjust one or more downstream process tools. Process tools 112 which may be adjusted may include, but are not limited to, a lithography tool, a deposition tool, a polishing tool, an etching tool, a bonder, and the like. In this regard, the predicted overlay information may be used to minimize (or at least mitigate) the overlay observed on the bonded wafer pair 110c.

In embodiments, pre-bonding shape measurements of wafers 110a, 110b combined with the model for determining distortions can be used to select pairs of wafers for bonding to minimize overlay errors.

One skilled in the art will recognize that the herein described components, operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A wafer shape metrology system comprising:
   a wafer shape metrology sub-system configured to perform one or more stress-free shape measurements on a first wafer, a second wafer, and a post-bonding pair of the first wafer and the second wafer; and
   a controller communicatively coupled to the wafer shape metrology sub-system, the controller including one or more processors configured to execute a set of program instructions stored in a memory, the set of program instructions configured to cause the one or more processors to:
   receive the one or more stress-free shape measurements from the wafer shape sub-system;
   predict overlay between one or more features on the first wafer and one or more features on the second wafer based on the one or more stress-free shape measurements of the first wafer, the second wafer, and the post-bonding pair of the first wafer and the second wafer; and
   provide a feedback adjustment to one or more process tools based on the predicted overlay.

2. The wafer shape metrology system of claim 1, wherein the predicting the overlay between the one or more features on the first wafer and the one or more features on the second wafer based on the one or more stress-free shape measurements of the first wafer, the second wafer, and the post-bonding pair of the first wafer and the second wafer comprises:
   extracting one or more wafer shape parameters from the one or more stress-free shape measurements of the first wafer, the second wafer, and the post-bonding pair of the first wafer and the second wafer.

3. The wafer shape metrology system of claim 2, wherein the extracted one or more wafer shape parameters comprises at least one of local shape curvature (LSC) or in-plane distortion (IPD).

4. The wafer shape metrology system of claim 2, further comprising:
   inputting the extracted one or more wafer shape parameters into a machine learning algorithm to predict the overlay between the one or more features on the first wafer and the one or more features on the second wafer.

5. The wafer shape metrology system of claim 4, furthering comprising:
   training the machine learning algorithm.

6. The wafer shape metrology system of claim 5, wherein the training the machine learning algorithm comprises:
   training the machine learning algorithm with infrared overlay data.

7. The wafer shape metrology system of claim 2, further comprising:
   inputting the extracted one or more wafer shape parameters into a mechanical model to predict the overlay between the one or more features on the first wafer and the one or more features on the second wafer.

8. The wafer shape metrology system of claim 1, wherein the providing the one or more feedback control signals to the one or more process tools based on the predicted overlay comprises:
   providing the one or more feedback control signals to a bonder based on the predicted overlay to adjust one or more process controls of the bonder.

9. The wafer shape metrology system of claim 1, wherein the wafer shape metrology sub-system comprises a first interferometer sub-system and a second interferometer sub-system.

10. A system comprising:
    a controller configured to receive shape measurements from a wafer shape metrology sub-system, the controller including one or more processors configured to execute a set of program instructions stored in a memory, the set of program instructions configured to cause the one or more processors to:
    receive one or more stress-free shape measurements from a wafer shape sub-system;
    predict overlay between one or more features on a first wafer and one or more features on a second wafer based on the one or more stress-free shape measurements of the first wafer, the second wafer, and the post-bonding pair of the first wafer and the second wafer; and
    provide a feedback adjustment to one or more process tools based on the predicted overlay.

11. The system of claim 10, wherein the predicting overlay between the one or more features on the first wafer and the one or more features on the second wafer based on the one or more stress-free shape measurements of the first wafer, the second wafer, and the post-bonding pair of the first wafer and the second wafer comprises:
    extracting one or more wafer shape parameters from the one or more stress-free shape measurements of the first wafer, the second wafer, and the post-bonding pair of the first wafer and the second wafer.

12. The system of claim 11, wherein the extracted one or more wafer shape parameters comprises at least one of local shape curvature (LSC) or in-plane distortion (IPD).

13. The system of claim 11, further comprising:
    inputting the extracted one or more wafer shape parameters into a machine learning algorithm to predict overlay between the one or more features on the first wafer and the one or more features on the second wafer.

14. The system of claim 13, furthering comprising:
    training the machine learning algorithm.

15. The system of claim 14, wherein the training the machine learning algorithm comprises:
    training the machine learning algorithm with infrared overlay data.

16. The system of claim 10, further comprising:
    inputting the extracted one or more wafer shape parameters into a mechanical model to predict overlay between one or more features on the first wafer and one or more features on the second wafer.

17. The system of claim 10, wherein the providing one or more feedback control signals to the one or more process tools based on the predicted overlay comprises:
    providing the one or more feedback control signals to a bonder based on the predicted overlay to adjust one or more process controls of the bonder.

18. The system of claim 10, wherein the wafer shape metrology sub-system comprises a first interferometer sub-system and a second interferometer sub-system.

19. A method comprising:
    acquiring one or more stress-free shape measurements for a first wafer, a second wafer, and a post-bonding pair of the first wafer and the second wafer;
    predicting overlay between one or more features on the first wafer and one or more features on the second wafer based on the one or more stress-free shape measurements of the first wafer, the second wafer, and the post-bonding pair of the first wafer and the second wafer; and
    providing a feedback adjustment to one or more process tools based on the predicted overlay.

* * * * *